(12) United States Patent
Uusimaki et al.

(10) Patent No.: US 8,226,442 B2
(45) Date of Patent: Jul. 24, 2012

(54) REMOVABLE ELECTRONIC MODULE (75) Inventors: Matti Uusimaki, Pirkkala (FI); Timo T. Laitinen, Viiala (FI)

(73) Assignee: Nokia Corporation, Espoo (FI)

( * ) Notice: Subject to any disclaimer, the term of this patent is extended or adjusted under 35 U.S.C. 154(b) by 1449 days.

(21) Appl. No.: 11/713,346

(22) Filed: Mar. 2, 2007

(65) Prior Publication Data

US 2008/0212291 A1     Sep. 4, 2008

(51) Int. Cl.
H01R 24/00      (2011.01)
(52) U.S. Cl. ............. 439/630; 439/67; 439/74; 439/66; 439/91; 439/264; 439/248; 439/131; 439/164; 439/165; 439/595; 439/86; 439/260; 439/259; 455/558; 455/575.1
(58) Field of Classification Search .............. 455/550.1, 455/550, 420, 41; 235/492, 441; 439/630, 439/67, 91, 74, 66
See application file for complete search history.

(56) References Cited

U.S. PATENT DOCUMENTS

| | | | |
|---|---|---|---|
| 6,954,653 B2 * | 10/2005 | Morita | 455/550.1 |
| 2002/0002036 A1 * | 1/2002 | Uehara et al. | 455/41 |
| 2002/0049070 A1 * | 4/2002 | Bick | 455/550 |
| 2004/0043643 A1 | 3/2004 | Adams et al. | 439/71 |
| 2005/0128319 A1 * | 6/2005 | Morino | 348/231.7 |
| 2005/0279838 A1 * | 12/2005 | Wang et al. | 235/492 |
| 2006/0143352 A1 | 6/2006 | Park | 710/301 |
| 2006/0273174 A1 * | 12/2006 | Laitinen et al. | 235/441 |
| 2007/0042767 A1 * | 2/2007 | Stepanian | 455/420 |

* cited by examiner

Primary Examiner — Edward Urban
Assistant Examiner — Ganiyu Hanidu
(74) Attorney, Agent, or Firm — Harrington & Smith (57) ABSTRACT

An electronic module adapted to be removably, operably connected to an electronic device. The electronic module includes a housing; at least one electronic component in the housing; and a plurality of electrical contact areas. The housing has a general electronic card shape with relatively large top and bottom sides and relatively thin side edges between the top and bottom sides. The plurality of electrical contact areas are located on a first one of the side edges. The electrical contact areas are connected to the at least one electronic component such that, when the electronic module is operably connected to the electronic device, the electrical contact areas on the first side edge are adapted to electrically couple the at least one electronic component to the electronic device along the first side edge.

5 Claims, 8 Drawing Sheets

REMOVABLE ELECTRONIC MODULE

BACKGROUND OF THE INVENTION

1. Field of the Invention

The invention relates to connection of a removable electronic module and, more particularly, to a connection which can occupy less space than conventional removable electronic module connections.

2. Brief Description of Prior Developments

Electronic module readers, such as a memory card reader for example, are provided in portable electronic devices, such as mobile telephones, digital cameras and hand-held games, for example. The readers allow a user to removably insert different modules for use by the device. In the past, the some readers were provided with a first switch for detecting the presence of a memory module in the reader. The reader could also have a separate second switch for signally a pre-warning if the module was being removed or ejected from the reader. This second switch was to allow for "hot swapping" of modules without having to turn OFF power to the device.

U.S. Patent Publication No. 2006/0273174 A1, which is hereby incorporated by reference in its entirety, discloses an electronic module reader with a module detection and ejection pre-warning switch. U.S. Patent Publication No. 2004/0043643 A1, which is hereby incorporated by reference in its entirety, discloses peripheral leads on an electrical interconnect. U.S. Patent Publication No. 2006/0143352 A1, which is hereby incorporated by reference in its entirety, discloses an electronic device having a memory card detachment/attachment recognition function and method.

There is a desire to make thinner mobile phones and other hand-held portable electronic devices. Height of the memory card reader mechanics is one limiting factor for creating thinner designs. The main reason for this height problem is that the contacts of the card are under the card (the bottom side of the card) which forces the reader design to be implemented under the bottom of the card. For good and reliable connection the reader needs to be implemented with spring contacts, and they are located under the card. This increases the height of the assembly. Another factor increasing the height of the assembly is the additional mechanics to detect card removal information. There is a desire to reduce the height or thickness of a card and card reader assembly to thereby enable design of thinner electronic devices, such as mobile phones for example. Conventional designs for card removal and detection also add complexity of design mechanisms. This increases costs and may be prone to failure. Thus, there is also a desire to reduce complexity of card removal and detection.

SUMMARY OF THE INVENTION

In accordance with one aspect of the invention, an electronic module adapted to be removably, operably connected to an electronic device is provided. The electronic module includes a housing; at least one electronic component in the housing; and a plurality of electrical contact areas. The housing has a general electronic card shape with relatively large top and bottom sides and relatively thin side edges between the top and bottom sides. The plurality of electrical contact areas are located on a first one of the side edges. The electrical contact areas are connected to the at least one electronic component such that, when the electronic module is operably connected to the electronic device, the electrical contact areas on the first side edge are adapted to electrically couple the at least one electronic component to the electronic device along the first side edge.

In accordance with another aspect of the invention, an electronic module adapted to be removably, operably connected to an electronic device is provided. The electronic module comprises a housing; at least one electronic component in the housing; an electrical contact area; and a removal detection system. The housing has a general electronic card shape with relatively large top and bottom sides and relatively thin side edges between the top and bottom sides. The electrical contact area is located proximate a first end of the housing for electrically coupling the at least one electronic component to the electronic device. The removal detection system is adapted to detect when a user is initiating removal of the electronic module from the electronic device. The removal detection system comprises a user input on one of the side edges of the housing at an opposite second end of the housing.

In accordance with another aspect of the invention, an electronic module adapted to be removably, operably connected to an electronic device is provided. The electronic module includes a housing; at least one electronic component in the housing; an electrical contact area proximate a first end of the housing for electrically coupling the at least one electronic component to the electronic device; and a user input at an opposite second end of the housing. The user input comprises an electronic touch sensor adapted to send an electrical signal when a user touches the touch sensor with a finger.

In accordance with another aspect of the invention, a method of detecting initiation of removal of a removable electronic module by a user from an electronic device is provided comprising providing the removable electronic module with a sensing system to sense when a user is initiating removal of the electronic module from the electronic device, wherein the sensing system comprises a user input; sending a signal from the user input when the user has activated the user input; and determining when a user has activated the user input of the electronic module at least partially based upon receipt of the signal by an electronic component of the electronic module.

In accordance with another aspect of the invention, a method of detecting initiation of removal of a removable electronic module from an electronic device is provided comprising providing the electronic module with a touch sensor which is adapted to sense when a user touches the touch sensor and generate an electrical signal; and sending the signal to a shut down system for at least partially terminating use of the electronic module by the electronic device before removal of the electronic module from the electronic device.

In accordance with another aspect of the invention, an electrical connector is provided comprising a housing; a resilient member mounted in the housing, wherein the resilient member comprises electrically non-conductive flexible material; and a plurality of substantially rigid electrical contacts mounted to the resilient member. The electrical contacts each comprise a first side having a first contact area which is adapted to contact a removable electronic module and a second side, which is offset about 90 degrees from the first side, and which is adapted to contact a second contact area on an electronic component.

In accordance with another aspect of the invention, a program storage device is provided which readable by a machine, tangibly embodying a program of instructions executable by the machine for performing operations to detect initiation of removal of a removable electronic card from a card reader, the operations comprising: determining when a user has touched a touch sensor of a user input at an end of the removable electronic card, wherein the touch sensor is adapted to generate a signal when the user touches the touch sensor; and based upon receipt of the signal from the touch sensor, terminating use of the electronic module by the card reader.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENTS

Figure 1:
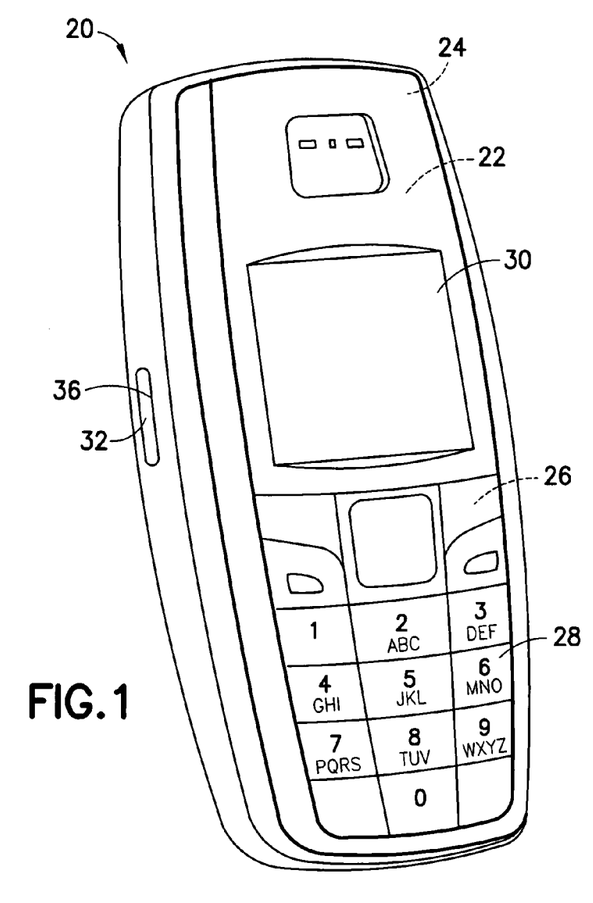
FIG. 1 is a perspective view of a portable electronic device comprising features of the invention.

Referring to FIG. 1, there is shown a perspective view of a portable electronic device 20 incorporating features of the invention. Although the invention will be described with reference to the exemplary embodiments shown in the drawings, it should be understood that the invention can be embodied in many alternate forms of embodiments. In addition, any suitable size, shape or type of elements or materials could be used.

In this embodiment the device 20 comprises a mobile telephone. However, in alternate embodiments the device could comprise any suitable type of electronic device adapted to removably receive an electronic module, such as a memory card. For example, the device 20 could comprise a digital camera, a music player, a hand-held gaming device, a PDA, or a notebook computer. The telephone 20 generally comprises a transceiver 22 connected to an antenna 24, a controller 26, a keypad 28 and a display 30. The telephone 20 can have any suitable type of features as known in the art.

Figure 2:
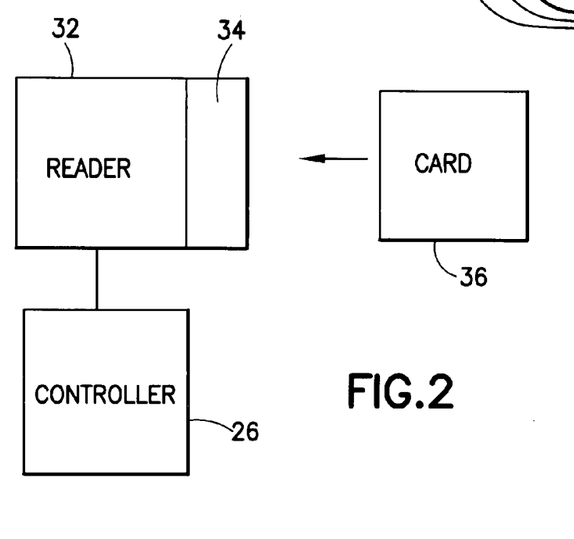
FIG. 2 is a diagram illustrating some of the features of the device shown in FIG. 1.

The telephone 20 also comprises an electronic module reader 32 coupled to the controller 26. In this embodiment the reader 32 is shown with an entrance at the side of the telephone. However, the entrance could be at any suitable location including the rear of the telephone, such as behind in a battery compartment area. The entrance could also have a door or hatch to close the entrance. Referring also to FIG. 2, the reader 32 includes an electrical connector 34. The electrical connector is adapted to make a removable, operable connection with the card or electronic module 36. The card can be, for example, a memory card or SIM card or any other suitable type of removable electronic module.

Figure 3:
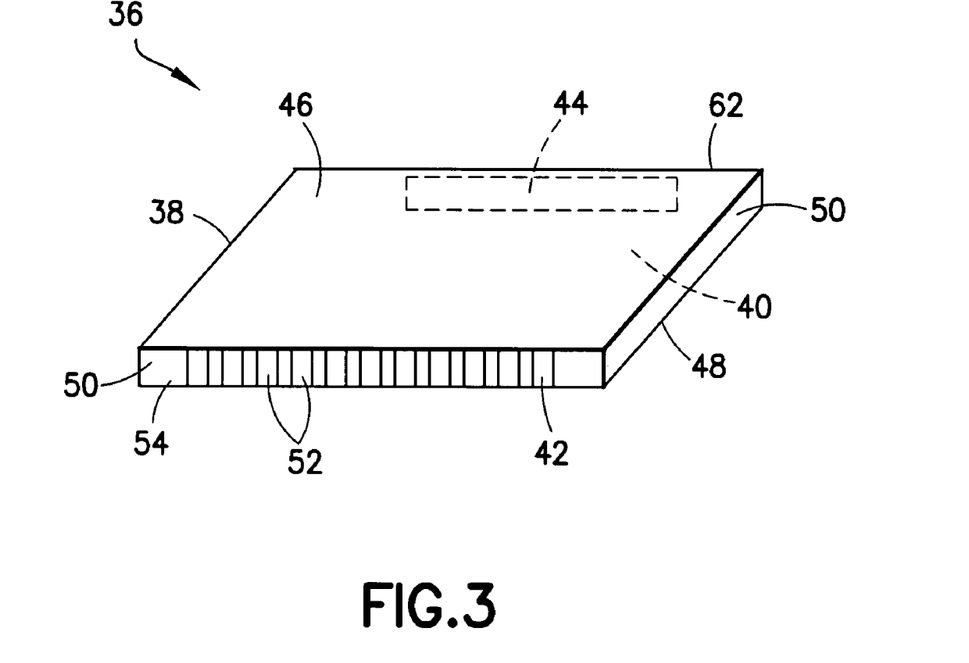
FIG. 3 is a perspective view of the removable electronic module shown in FIGS. 1 and 2.

Referring also to FIG. 3, the module 36 generally comprises a housing 38, at least one electronic component 40 located in the housing 38, an electrical contact area 42 and a user input 44. In an alternate embodiment the user input 44 might not be provided. The housing 38 forms a general electronic card shape with relatively large top and bottom sides 46, 48 and relatively thin perimeter or peripheral side edges 50 between the top and bottom sides. The at least one electronic component 40 can comprise, for example, one or more of a printed circuit board, a memory chip, a microprocessor, etc.

The electrical contact area 42 is located on a first side 54 of the side edges 50. The electrical contact area 42 has a plurality of contact pads 52 which can comprise stationary metallized contact pads on the housing 38 or stationary metal contacts connected to the housing 38. In one type of alternate embodiment, the contact pads 52 could comprise metallized pads formed along a side edge of the printed circuit board which is at the first side edge 54 of the housing. In another type of embodiment, the module 36 could comprise an electrical connector connected to the housing at the first side edge 54 forming the peripheral arranged stationary contact pads at the first side edge 54. In this embodiment the pads 52 have a general square or rectangular shape. As shown in the alternate embodiment 36' of FIG. 4, the pads 52' could extend into the edge 54' of the housing 38' with portions at the top and bottom sides 46, 48 as general half circle shapes at the corners of the pads.

Figure 5:
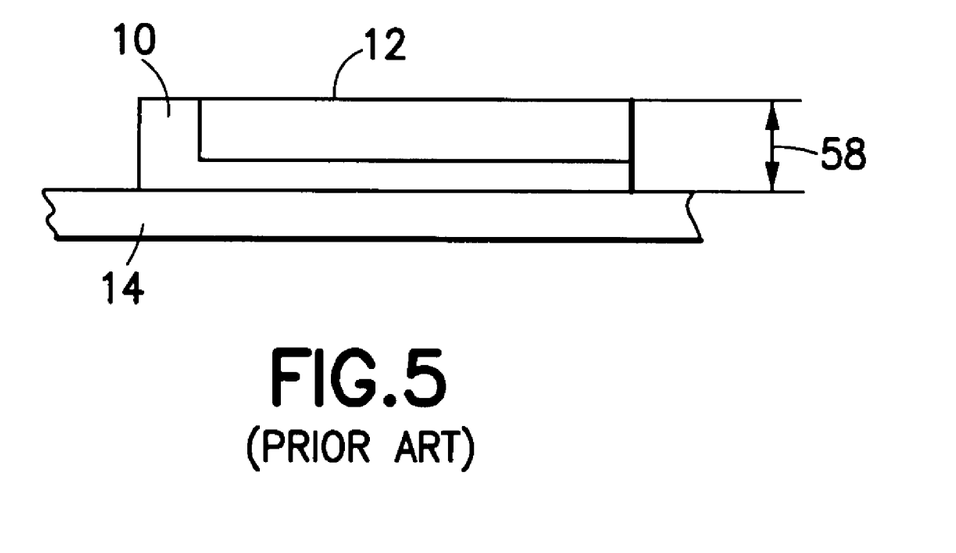
FIG. 5 is a side view showing connection of a conventional electronic memory card to a conventional card reader.
Figure 6:
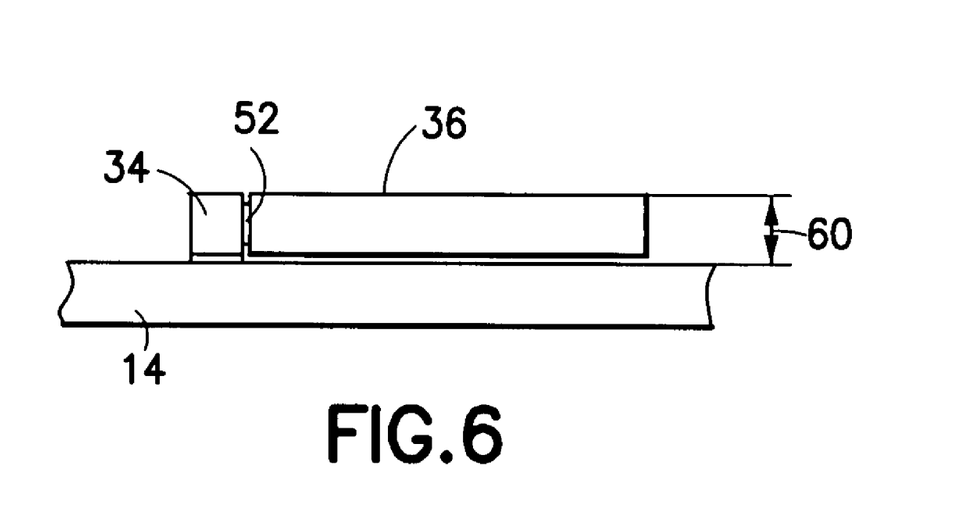
FIG. 6 is a side view showing connection of the module shown in FIG. 3 to the reader shown in FIG. 2.

This invention can provide an improvement in the field of mechanical and functional construction of different card interfaces. The invention can comprise changing the connection points from a conventional bottom side location to a perimeter or peripheral edge of a card and, thus, allow the card to be placed directly on a printed circuit board of the electronic device. This direct placement next to the board allows the height of the assembly to be reduced. As seen in FIG. 5, in the past a portion of a conventional card reader 10 was located between the bottom of a conventional card 12 and the printed circuit board 14 of the electronic device. As seen with reference to FIG. 6, by placing the contact pads 52 at the peripheral edge of a card, and providing a card reader 32 with edge contacting contacts rather than bottom side contacting contacts, the card 36 can be located closer to the printed circuit board 14. The conventional height 58 has been reduced to a smaller height 60.

An advantage of the invention is that the contacts are on the edge of the card, not under the card at the bottom side of the card. This makes possible to implement thinner card reader solutions, because the spring contacts are not located under the card. The connection can be done at the peripheral or perimeter edge of the card. The card can have fixed metal or metallized pads where the connection can be done. The techniques can be taken, for example, similar to Printed Wiring Board technology to have metal filled holes at the edge which are cut to half so there is half circle metallized pads available (see FIG. 16 for example). Or the technique can be developed from typical IC/component package technology where the pads are built at the edge of the component. But the main idea is that there is a contact surface available at the edge of the card.

Figure 4:
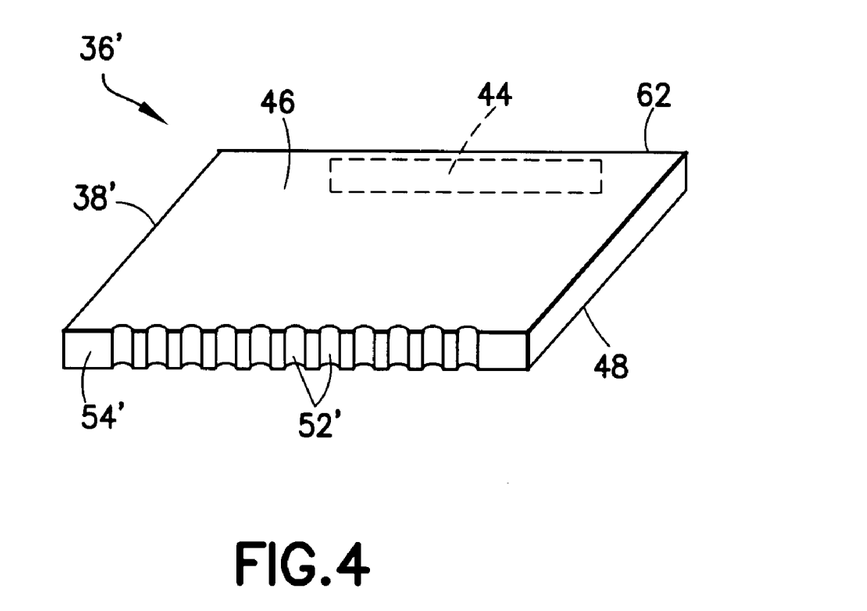
FIG. 4 is a perspective view of an alternate embodiment of the removable electronic module shown in FIG. 3.
Figure 7:
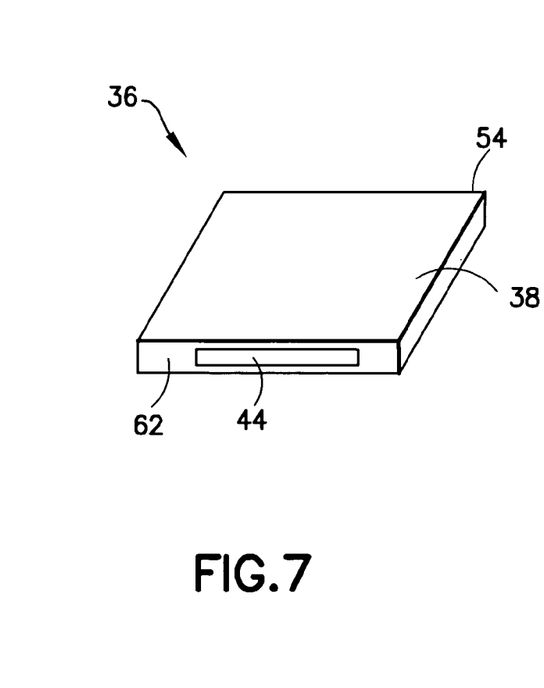
FIG. 7 is a perspective view of the removable electronic module shown in FIG. 3 from an opposite end.
Figure 8:
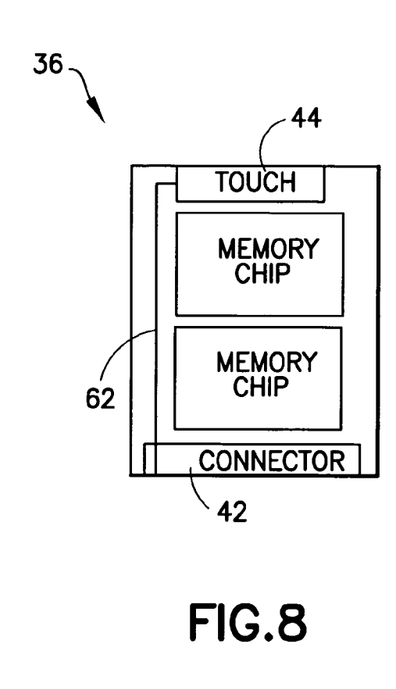
FIG. 8 is a diagram illustrating internal components of the removable electronic module shown in FIG. 3.
Figure 9:
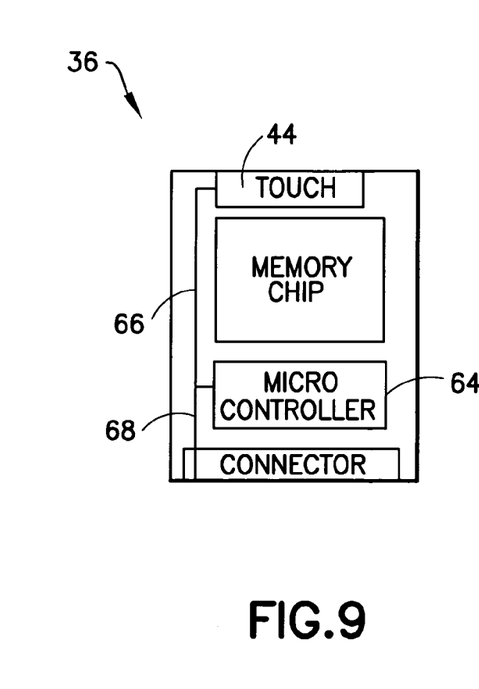
FIG. 9 is a diagram illustrating an alternate embodiment of the internal components of the removable electronic module shown in FIG. 3.

FIGS. 3 and 4 show examples of two card interface implementations. FIG. 3 shows a flat interface made to the card edge. FIG. 4 shows half cylinder shape contact areas. On both of the embodiments the user input 44 for removal indication is located at the opposite end 62 of the card from the contact pads 52. Referring also to FIGS. 7 and 8, in this embodiment the user input 44 comprises a touch sensitive area which is adapted to sense when a user touches the area with his or her finger. A similar embodiment is shown in FIG. 9. However, in alternate embodiments any suitable type of user input could be provided, such as a manually actuated user switch for example.

With the invention, card removal information can be implemented inside the card itself with very small space need compared to existing solutions on card readers. An advantage of the invention is that the card removal information is integrated to the card already, and the information can be used directly on the card and/or it can be routed out via a connector pin or pad to be used in the host electronic device 20. Because the detection can be done when someone is touching the card, the timing advance generated will be useful to safely shut down the card during a hot swap. Card removal information might need an additional pin or pad for card interface, but the total solution is smaller because no additional system is needed in the reader mechanics. Also, although the cost of the card will be a little bit higher because of the added touch sensing system, it should be easy to implement and there is still an advantage in card data protection (because of longer shut down period available for card because of earlier detection).

The card removal information can be sensed at the outer end of the card. There can be some type of touch sensitive system to recognize if a user is touching the card and obviously trying to remove it. The sensing system can be implemented with any possible type of touch sensitive means, such as capacitive, resistive, etc, touch sensing systems, or even with a simple mechanical switch, such as a manual, user actuated electrical switch. One aspect of the invention is that it is recognized if someone is trying to push the card out as soon as the user touches the card. This information can be used inside the card to safely shut down operation of the card and/or it can be delivered out from the card, such as via an additional pin for example.

FIGS. 8 and 9 show how the touch sensitive area 44 can be located at the end of the card or module 36 having two different internal electrical configurations. In the embodiment shown in FIG. 8, the signal is directly connected by a conductor 62 from the touch sensitive element 44 to a connector area 42 to be used in the host side of the electronic device. In the embodiment shown in FIG. 9 the touch sense information is used in a card internal controller unit 64. The user input 44 is operably coupled to the controller 64 by a conductor 66. The controller 64 is connected to the connector area 42 by another conductor 68.

Figure 10:
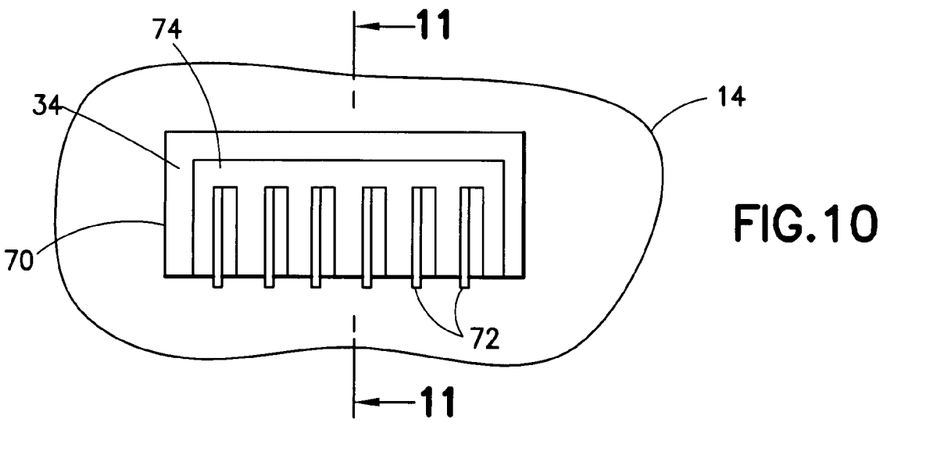
FIG. 10 is a schematic top cross sectional view of the electrical connector shown in FIG. 6.
Figure 11:
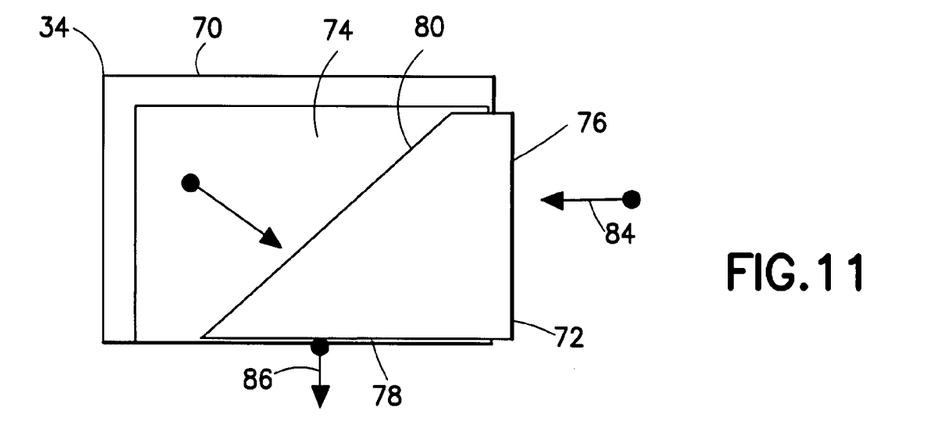
FIG. 11 is a cross sectional view taken along line 11-11 or FIG. 10.

FIG. 10 is a top schematic view of the internal structure of an electrical connector 34 for use in connecting the card or module 36 to another electronic component, such as a printed circuit board (PCB) 14 for example. Outside is a rigid housing 70. Referring also to FIG. 11, the electrical connector 34 generally comprises the housing 70, electrical contacts 72 and a resilient member 74. The resilient member 74 is a flexible non-conductive material, such as an elastomeric material. The resilient member 74 has a general block shape and is located inside the housing 70. The elastomeric material can be the same type of material as used in "zebra" connector which are used in connecting a display to a PCB. The flexible material gives resilient, spring movement capability to the contacts 72 which are made typically from metal and inserted into this flexible material, or molded on the contacts.

Figure 12:
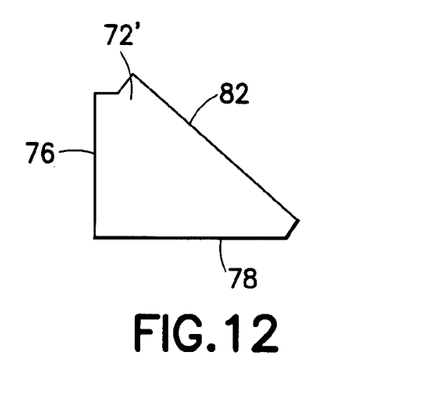
FIG. 12 is a side view of a contact blank used to form one of the contacts of the connector shown in FIGS. 10-11.
Figure 13:
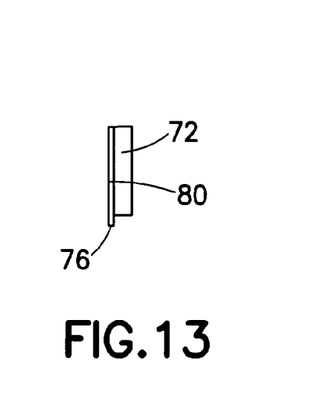
FIG. 13 is a top plan view of one of the contacts shown in FIGS. 10-11.

The contacts 72 preferably have a special shape to facilitate a controlled movement of the contacts 72 when they are moved by the module 36. Referring also to FIG. 12, the contacts 72 each comprise a flat sheet metal member 72' which has been cut and is subsequently formed into the shape shown in FIGS. 11 and 13. The contact 72 has a general triangular or pyramid shape with a first side 76, a second side 78 and a third side 80. This is merely an exemplary shape and should not be considered as limiting the invention. The first side 76 forms a contact area for contacting one of the contact pads 52 on the module 36. The second side 78 forms a contact area for contacting one of the contact pads on the PCB 14. The second side is generally orthogonal to the first side. The third side 80 forms a general angled side. As seen in FIG. 12, the member 72' has a flap 82. The flap 82 is bent 90 degrees to form an enlarged surface area along the third side 80. The diagonal edge is bent to form the side 80 to prevent the side 80 from piercing into the flexible material 74 in long term usage; thereby preventing the contact 72 from permanently moving deeper into the material 74. The flexible material 74 gives room for movement of the contacts 72 so the tolerances on the card edge can be balanced out and a good connection is provided. Although FIG. 12 shows an unbent metal sheet and FIG. 13 shows the bent metal contact, this part can be implemented also in other means if reasonable (such as metallized plastic, etc. for example).

Figure 14:
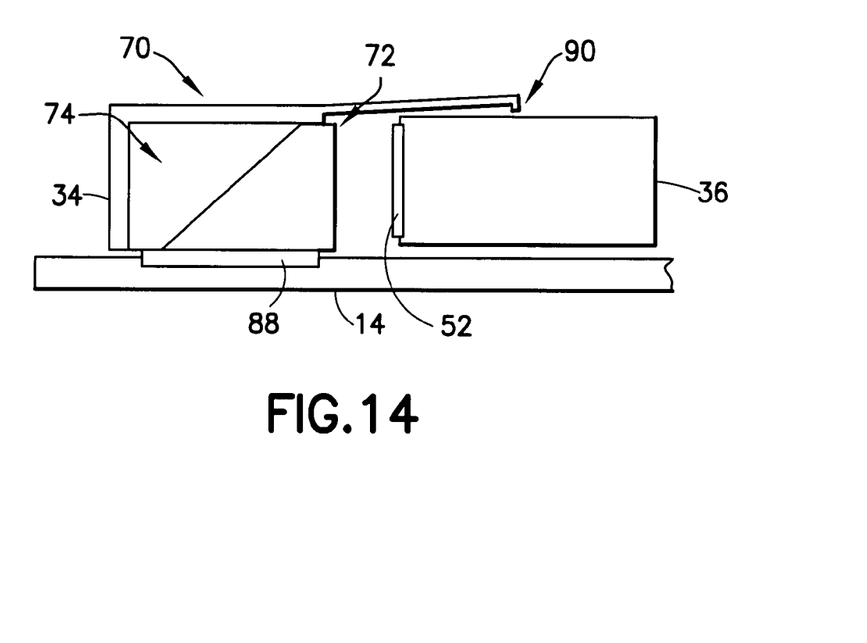
FIG. 14 is a cross sectional view illustrating connection of the module 36 to the connector shown in FIG. 11 shown attached to a printed circuit board.

As seen in FIGS. 11 and 14, the module 36 can press the metal contact 72 and, because of the triangle shape of the contact 72, the flexible material 74 converts the card pressure 84 on the first side 76 to pressure 86 at the second side 78 against a signal pad 88 on the PCB 14. The card horizontal force 84 is transferred to vertical force 86 on the board 14. Because of these forces, the housing 70 should be rigid enough to maintain good contact forces to the module 36 and to the pads on the PCB from the contacting metal contact 72. In the embodiment shown in FIG. 14, the housing 70 includes a possible locking mechanism 90. The locking mechanism 90 can lock the module 36 in a connected position with the connector 34 with the resilient member 74 compressed. However, in alternate embodiments any suitable locking mechanism could be provided, and might not be part of the connector 34. Alternatively, such as when a different type of connector is used, a locking mechanism might not be provided.

Figure 15:
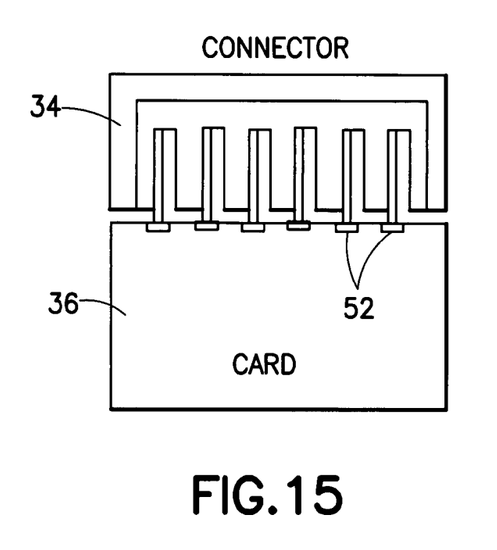
FIG. 15 is a schematic top cross sectional view of the assembly of the card and the connector shown in FIG. 14.
Figure 16:
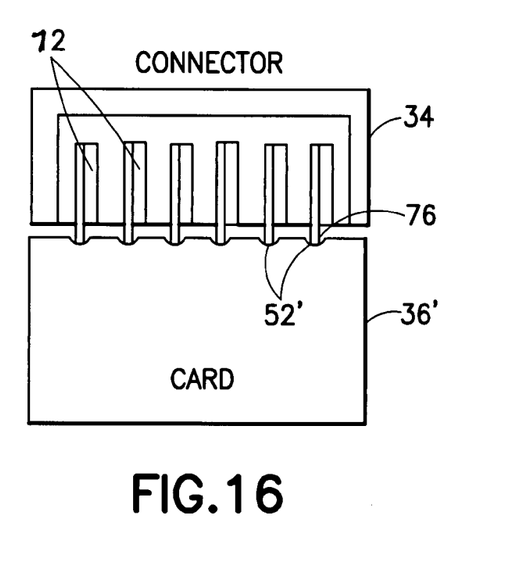
FIG. 16 is a schematic top cross sectional view similar to FIG. 15 of the assembly of the card shown in FIG. 4 and the connector shown in FIG. 14.

FIG. 15 presents how the module 36 is making a connection to the connector 34. With this approach a very dense pitch-to-card interface can be implemented; meaning that there will be many signals available on a small length of edge. FIG. 16 shows how the half cylinder shaped contact area 52' on the card 36' can be used to guide the contacts 72 to the middle of the card contact areas 52'.

Figure 17:
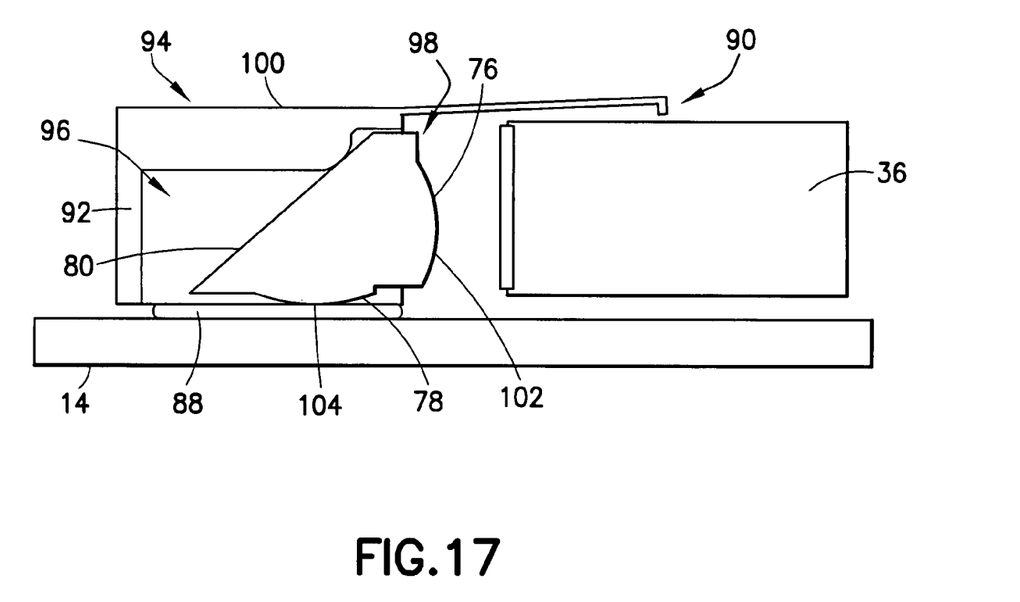
FIG. 17 is a cross sectional view similar to FIG. 14 illustrating connection of the module to an alternate embodiment of the connector shown in FIG. 11 shown attached to a printed circuit board.
Figure 18:
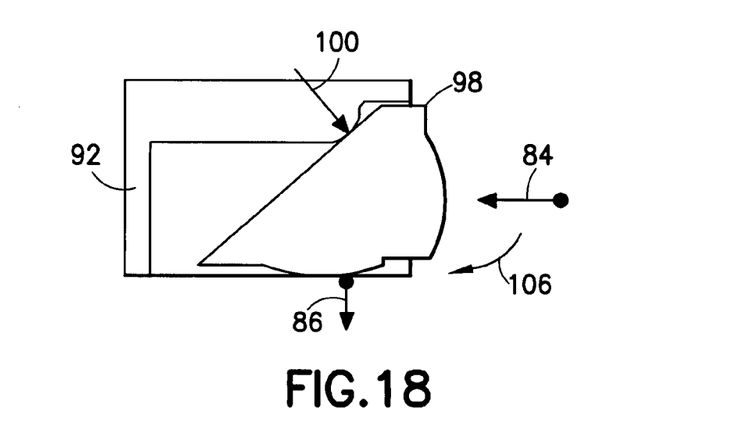
FIG. 18 is a cross sectional view of the connector shown in FIG. 17 showing how the contacts are rotated by connect with the electronic module.

Referring also to FIGS. 17 and 18 an alternate embodiment is shown. In this embodiment the connector 92 generally comprises a housing 94, resilient member 96, and electrical contacts 98. The housing 94 comprises a one piece member made of plastic or polymer material. The housing 94 includes the integral locking mechanism 90. The housing 94 includes a pivot surface 100. The pivot surface is located inside the main cavity of the housing which receives the resilient member 96. The resilient member 96 is substantially identical to the resilient member 74. The contacts 98 are identical to the contacts 72 except that the first side 76 has a rounded contact surface 102 and the second side 78 has a rounded contact surface 104. This embodiment illustrates that the contacts can have different shapes in different embodiments. In alternate embodiments, the first and second sides could have any suitable shapes. The third side 80 is located against both the resilient member 96 and the pivot surface 100. The pivot surface 100 is stationary and, unlike the resilient member 96, cannot be compressed.

As shown in FIG. 18, when the module 36 is connected to the connector 92, the contacts 98 rotate or pivot about the pivot area 100 as indicated by arrow 106. In this embodiment, in the upper corner the movement of the contact 98 is stopped with fixed housing corner 100 which contacts the contact 98 in such a way that the pressure on the bottom of metal contact edge is turning to force towards the board pad in the bottom right corner of the contact 98.

Implementation of the invention can consist of the two parts noted above, or only one of the two parts noted above. The first part can comprise the total solution idea of having contacts at the edge of the card to make the card thinner. The main target of this first part is to make card solution thinner by moving the connector mechanics of the card to the outside edge of the card area; at the outer peripheral edge of the card. The second part of idea is to reduce the space needed in card reader by moving the card removing detection into the card itself. Inside the card, the card removing detection system takes less space and the removal information can be noticed much earlier that with the today's connector solutions.

Figure 19:
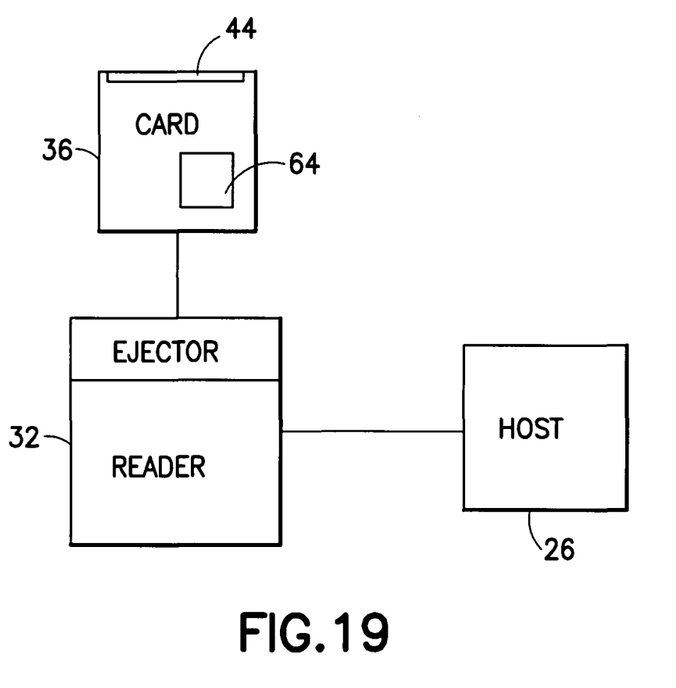
FIG. 19 is a diagram illustrating how an ejector of the reader can be controller by the removable electronic module or by the controller of the device receiving a signal from the removable electronic module.

This solution provides a new and innovative way of implementing the card interface in a small area and with less height than today's conventional card interfaces. Different applications and functions can be controlled through the memory card by a touch-sensitive switch or sensor. For example, the invention can be used for "Hot-Swap" pre-warning. A touch-sensitive switch gives the possibility to get longer delay time than known solutions, which are integrated to the card or card reader. A touch-sensitive switch on the card makes possible the warning time to be at least doubled. A touch-sensitive switch can be used for controlling an ejector device of memory card reader. When a user of the device touches the card sensitive surface, the electronics of the host device or memory card can eject the card out of the reader. This is illustrated, generally, in FIG. 19. With the module 36 operably connected to the reader 32, when a user contacts the touch sensitive sensor 44, the controller 26 of the host 20 or the controller 64 inside the module 36 could signal actuation of the ejector 108.

Figure 20:
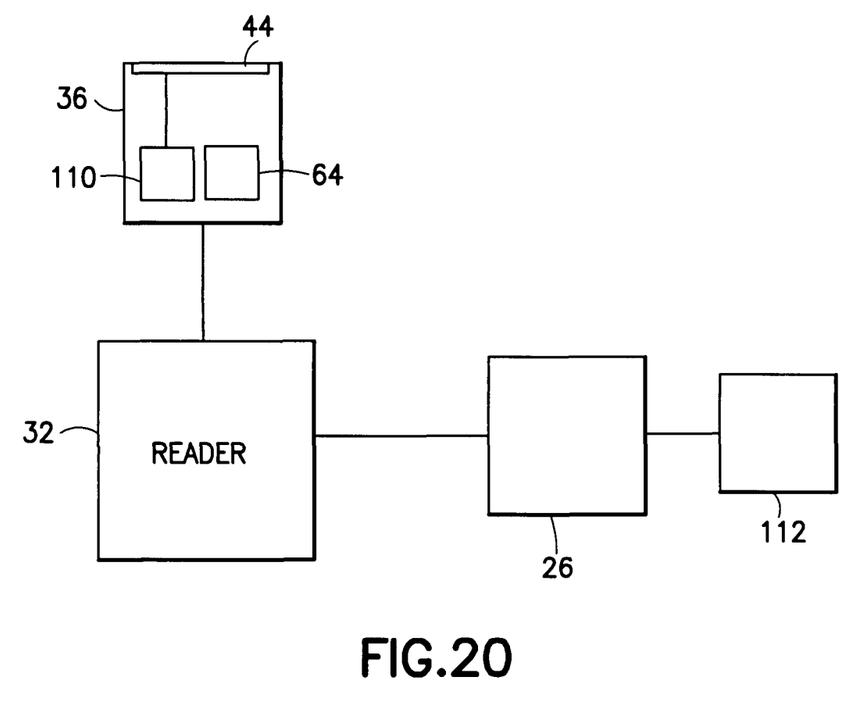
FIG. 20 is a diagram illustrating use of the user input of the removable electronic module as part of a fingerprint identification system; either in the removable electronic module or the portable electronic device.

Referring also to FIG. 20, in one type of embodiment the user input 44 could be part of a fingerprint detector 110 or 112. There are different possibilities to add intelligence for controlling use of the module 36; like many kinds of security features. Removal of the card 36 from the reader 32 could be prevented until the right person (as determined by the fingerprint detector 110 or 112) touches the module 36, or removal of the module 36 could be refused to selected people (as determined by the fingerprint detector 110 or 112). When the correct or approved user in a group of persons touches the module 36, that could be used to increase the amount of applications and features available for use with the host device. Alternatively or additionally, when a correct or approved user touches the module 36, this could open the speed and availability to the increased selection of the data in the module 36. Thus, one or more applications or memory data in the device 20 could available for use by all users, but one or more applications or memory data in the device 20 or module 36 could be available for use with only approved users as determined by the fingerprint detector 110 or 112 using the user input 44.

In the embodiments described above, a user's finger is only detected touching the module in one location. In an alternate embodiment, one or more sensors could be provided to sense one or more of the user's finger(s) in multiple locations or multiple directions. For example, the sensor(s) could be adapted to sense a user touching the card between two fingers, such as grasping the card between the two fingers. In this example, two sensors could be located at two different sides or edges of the card. In one type of alternate embodiment the finger sensor could be located on a major surface of the housing, such as the top surface. Thus, this could be used for a module which is inserted and/or removed with the electronic device at least partially in the direction of the bottom face of the housing rather than along a longitudinal axis; such as a video game cartridge into a game player for example.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:

1. An electrical connector comprising:
a housing;
a resilient member mounted in the housing, wherein the resilient member comprises electrically non-conductive flexible material; and
a plurality of substantially rigid electrical contacts mounted to the resilient member, wherein the electrical contacts each comprise a first side having a first contact area which is adapted to contact a removable electronic module, and wherein the electric contacts each comprise a second side, which is offset about 90 degrees from the first side, and which is adapted to contact a second contact area on an electronic component, wherein the electrical contacts are adapted to pivot relative to the housing.

2. An electrical connector as in claim 1 wherein the electrical contacts have a general triangular side profile.

3. An electrical connector as in claim 1 wherein a third side of the electrical contacts are located against the resilient member.

4. An electrical connector as in claim 1 wherein a third side of the electrical contacts are in movable contact with a portion of the housing.

5. An electrical connector as in claim 1 wherein, when removable electronic module is inserted into the electrical connector, the contacts are adapted to be moved by the removable electronic module in a first direction and the resilient member is adapted to move the contacts in a different second direction.

* * * * *